United States Patent
Register et al.

(10) Patent No.: US 10,681,469 B2
(45) Date of Patent: *Jun. 9, 2020

(54) SYSTEMS AND METHODS FOR COMMUNICATING THROUGH A HARD PLASTIC MASK

(71) Applicant: Ataia Inc., Roswell, GA (US)

(72) Inventors: Tyler Andrew Register, Dallas, TX (US); Amber Nicole Jackson, Raleigh, NC (US); Amy Lynn Foertsch, Atlanta, GA (US); An-kwok Ian Wong, Atlanta, GA (US)

(73) Assignee: ATAIA INC., Roswell, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/161,914

(22) Filed: Oct. 16, 2018

(65) Prior Publication Data
US 2019/0052975 A1 Feb. 14, 2019

Related U.S. Application Data

(63) Continuation of application No. 15/961,509, filed on Apr. 24, 2018, now Pat. No. 10,136,225.

(60) Provisional application No. 62/489,370, filed on Apr. 24, 2017, provisional application No. 62/572,023, filed on Oct. 13, 2017.

(51) Int. Cl.
| | |
|---|---|
| *H04B 15/00* | (2006.01) |
| *H04R 17/02* | (2006.01) |
| *H05K 1/02* | (2006.01) |
| *H05K 1/18* | (2006.01) |
| *H03F 3/19* | (2006.01) |

(Continued)

(52) U.S. Cl.
CPC ............... *H04R 17/02* (2013.01); *H03F 3/19* (2013.01); *H05K 1/028* (2013.01); *H05K 1/181* (2013.01); *H03F 2200/451* (2013.01); *H03H 17/02* (2013.01); *H04R 3/04* (2013.01); *H04R 2201/023* (2013.01); *H04R 2201/028* (2013.01); *H05K 1/189* (2013.01); *H05K 2201/10083* (2013.01)

(58) Field of Classification Search
CPC .... H04R 17/02; H04R 3/04; H04R 2201/023; H03F 3/19; H03F 2200/451; H05K 1/028; H05K 1/181
USPC .................................................. 381/94.1, 94.6
See application file for complete search history.

(56) References Cited

U.S. PATENT DOCUMENTS

| | | |
|---|---|---|
| 2,702,354 A | 2/1955 | Chorpening |
| 4,607,383 A | 8/1986 | Ingalls |

(Continued)

OTHER PUBLICATIONS

International Search Report dated Jul. 20, 2018 for related international patent application No. PCT/US18/29158.

*Primary Examiner* — Ammar T Hamid
(74) *Attorney, Agent, or Firm* — Morris, Manning & Martin, LLP; Bryan D. Stewart

(57) ABSTRACT

The present disclosure relates generally to providing a flexible patch and system for communicating through hard plastic masks such as CPAP/BiPAP® masks. Using electronic circuitry and novel designs, the present systems and methods can detect speech vibrations and output audible speech from hard plastic mask wearers. For example, in certain embodiments, the present systems and methods can recognize speech through a CPAP/BiPAP® mask, filter out non-human voice related noise, and output the resulting speech of the mask wearer.

21 Claims, 13 Drawing Sheets

EXEMPLARY SYSTEM ENVIRONMENT

(51) Int. Cl.
*H03H 17/02* (2006.01)
*H04R 3/04* (2006.01)

(56) References Cited

U.S. PATENT DOCUMENTS

| | | | |
|---|---|---|---|
| 4,718,415 A * | 1/1988 | Bolnberger | H04R 1/083 |
| | | | 128/201.19 |
| 4,799,263 A | 1/1989 | Banzinger et al. | |
| 5,572,990 A * | 11/1996 | Berlin | A62B 18/08 |
| | | | 128/201.19 |
| 5,845,636 A | 12/1998 | Gruenke et al. | |
| 6,997,178 B1 | 2/2006 | Reynaud | |
| 2007/0003096 A1* | 1/2007 | Nam | H04R 1/1091 |
| | | | 381/382 |
| 2011/0290256 A1* | 12/2011 | Sather | A61F 5/08 |
| | | | 128/207.18 |
| 2011/0299713 A1* | 12/2011 | Moller | H04R 25/60 |
| | | | 381/328 |
| 2012/0055471 A1 | 3/2012 | Hadas et al. | |
| 2016/0001110 A1* | 1/2016 | Hamilton | G10L 21/0364 |
| | | | 381/385 |
| 2016/0127841 A1* | 5/2016 | Horii | H04R 1/1016 |
| | | | 381/324 |
| 2018/0116863 A1* | 5/2018 | Shah | A61B 5/0878 |

\* cited by examiner

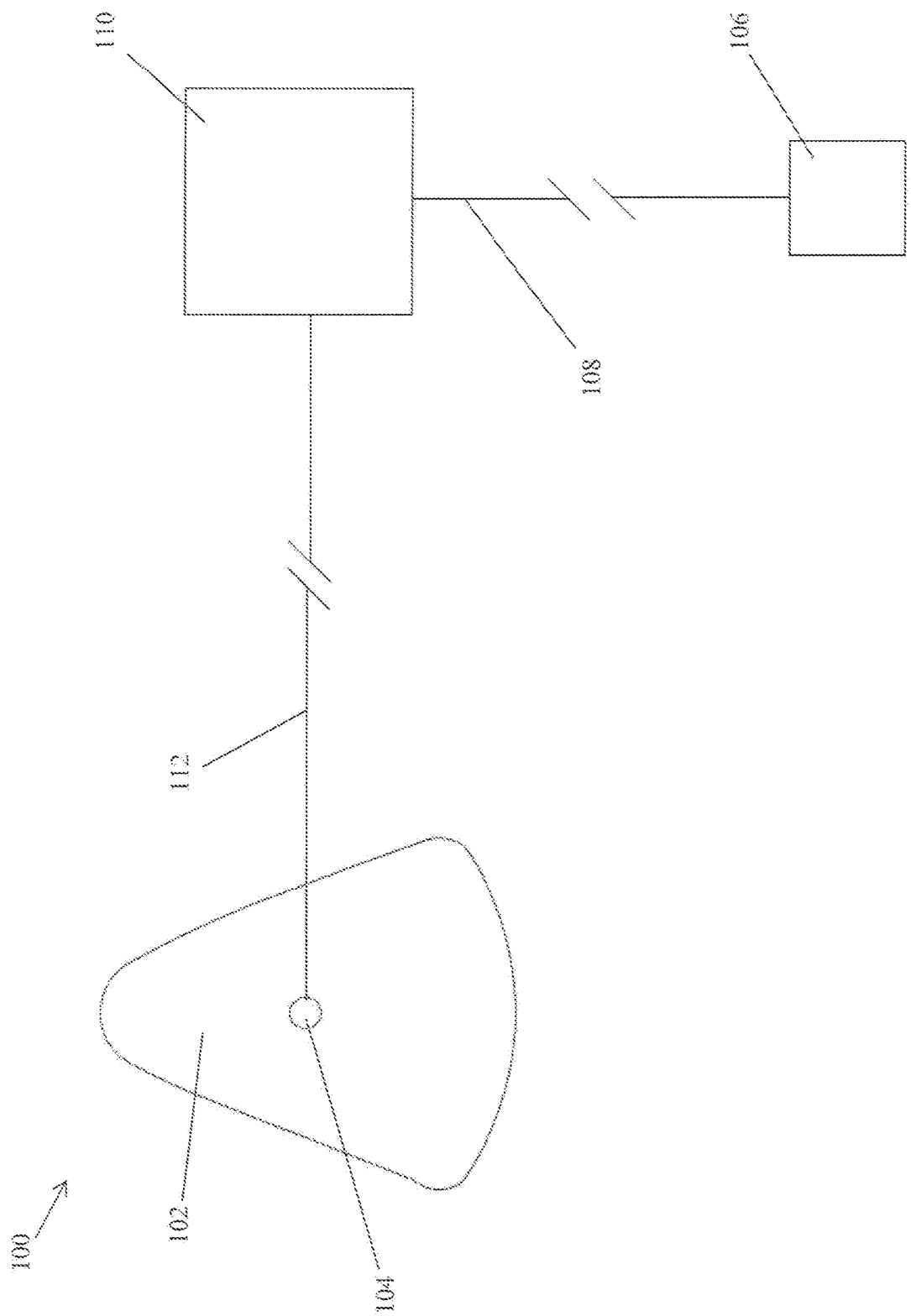
FIG. 1: EXEMPLARY SYSTEM ENVIRONMENT

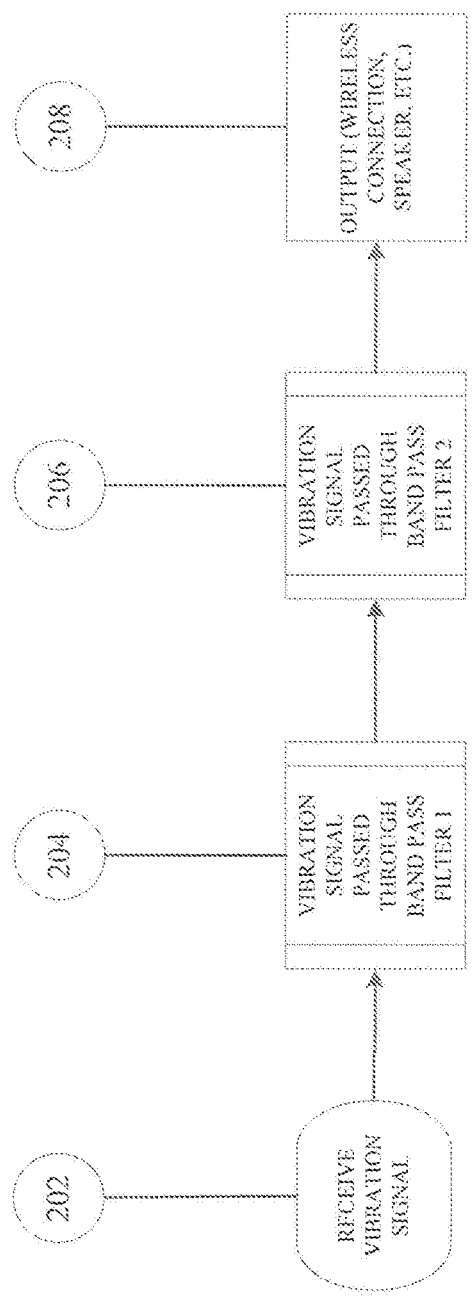
FIG. 2: EXEMPLARY SYSTEM COMPONENT DIAGRAM

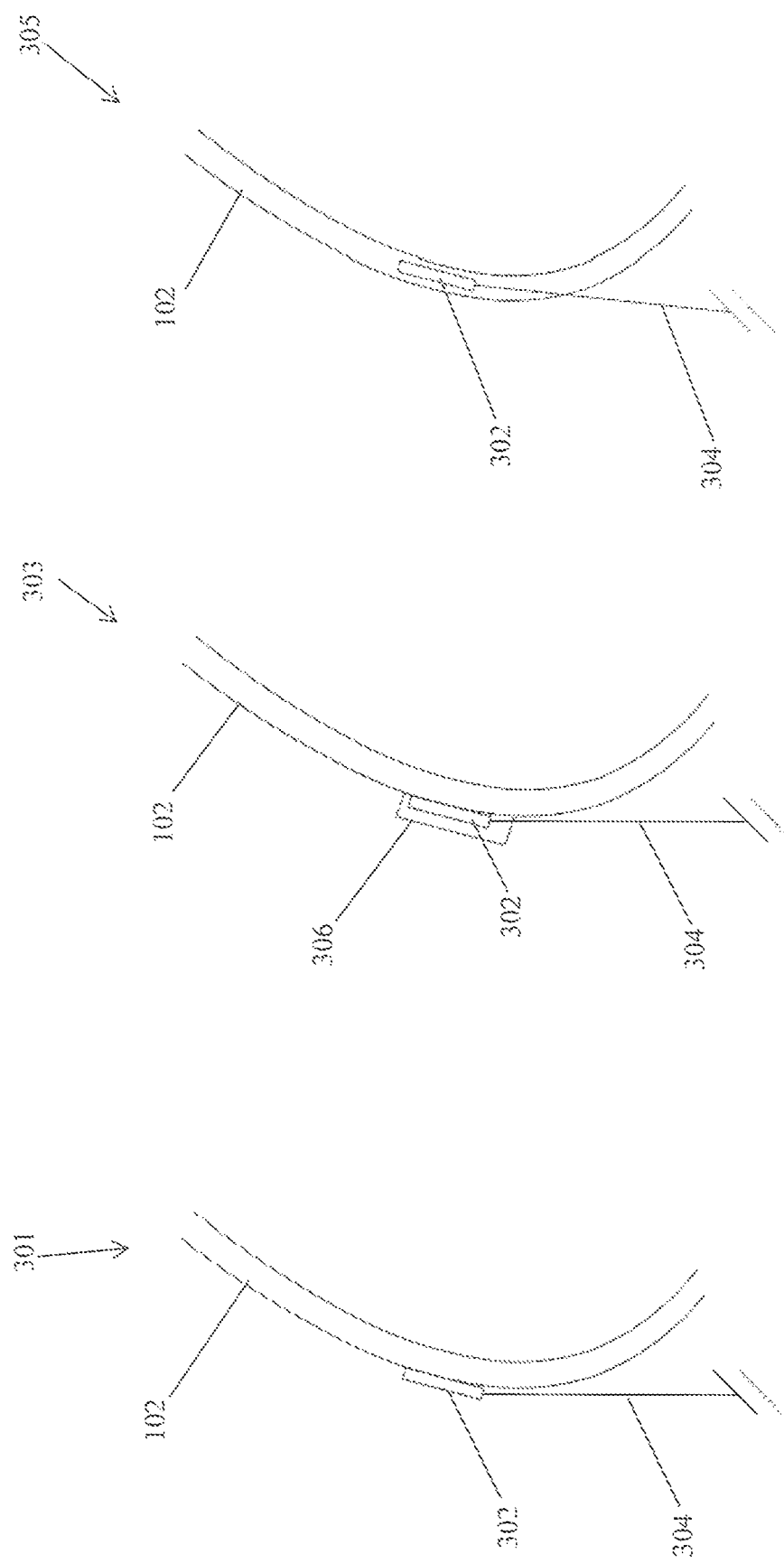

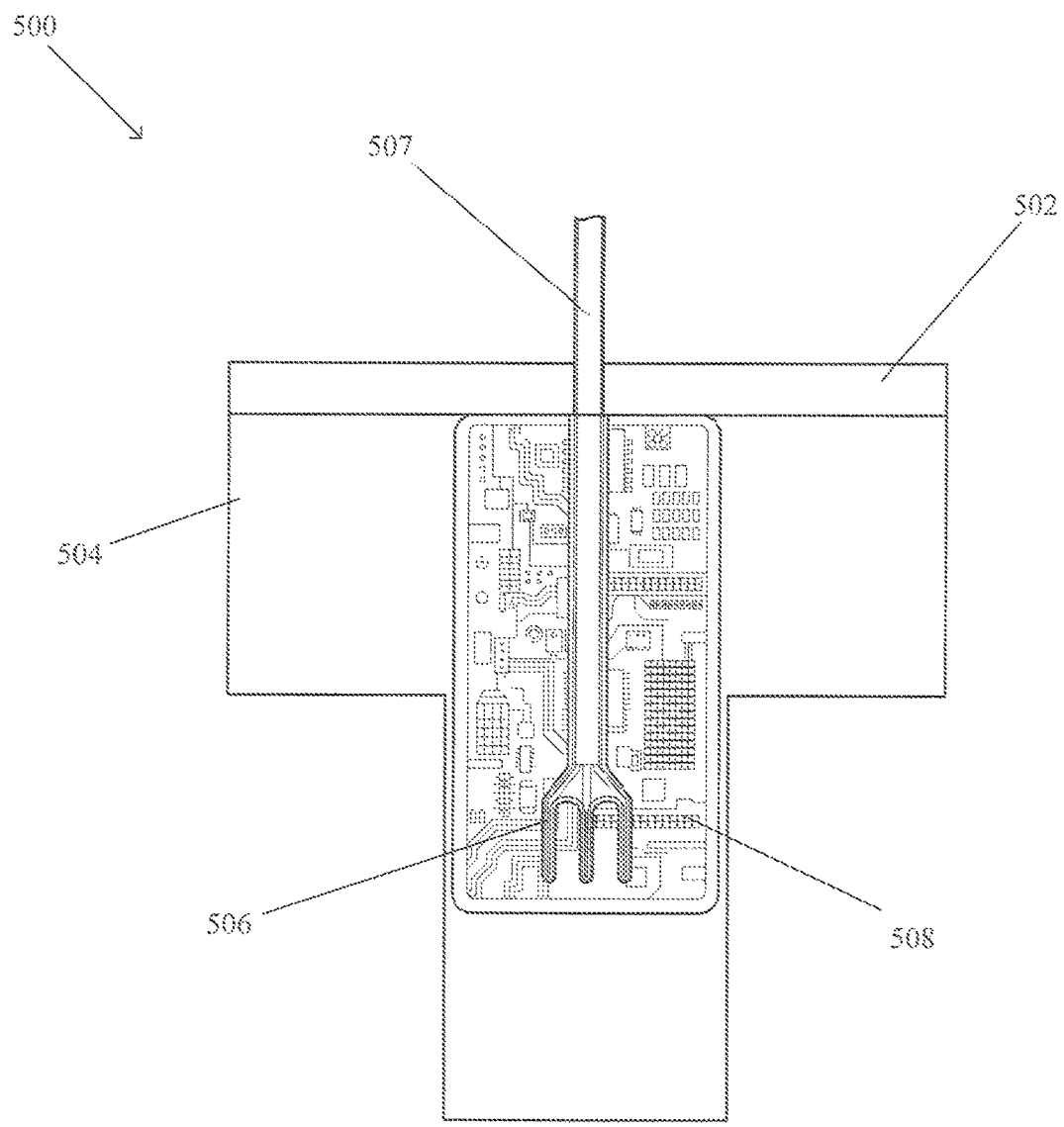
FIG. 5A: EXEMPLARY ALTERNATE FLEXIBLE CIRCUIT FRONT VIEW

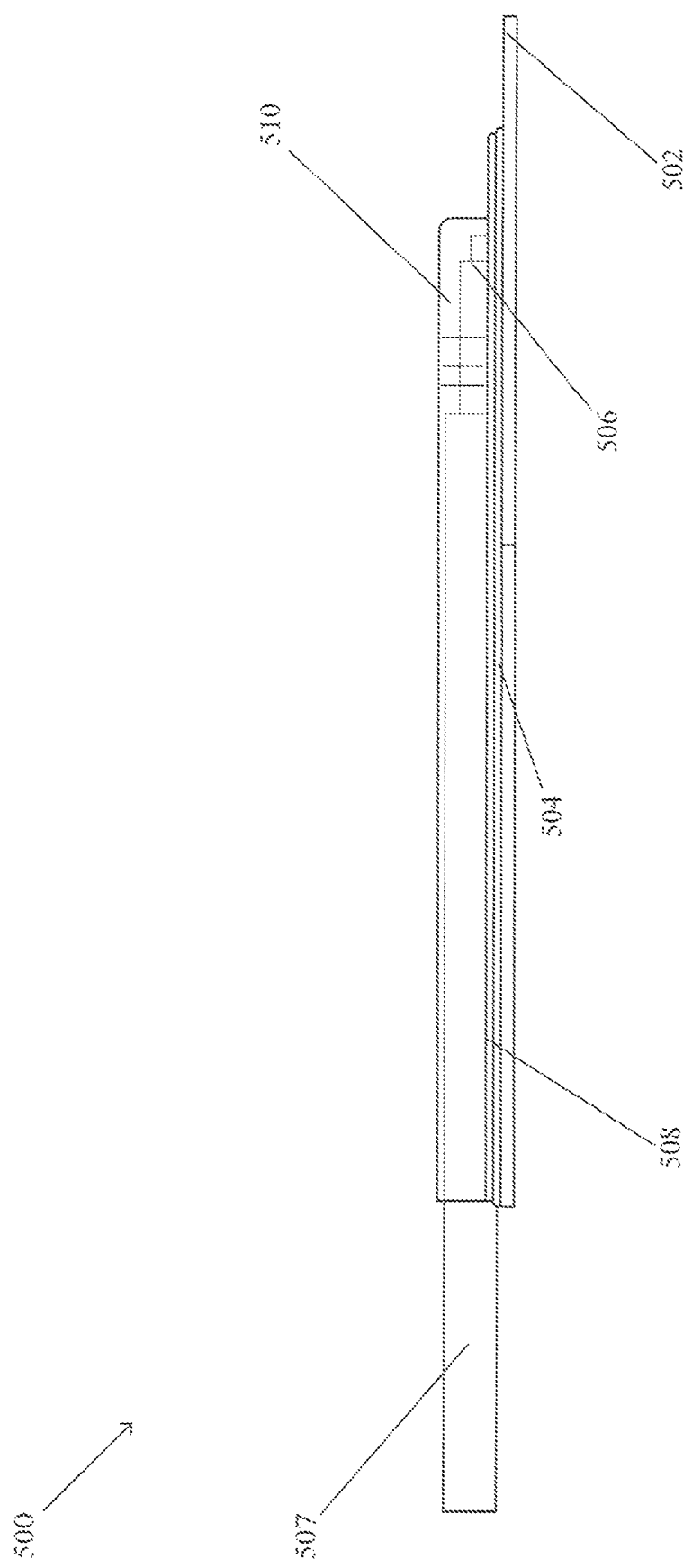
FIG. 5B: EXEMPLARY ALTERNATE FLEXIBLE CIRCUIT SIDE VIEW

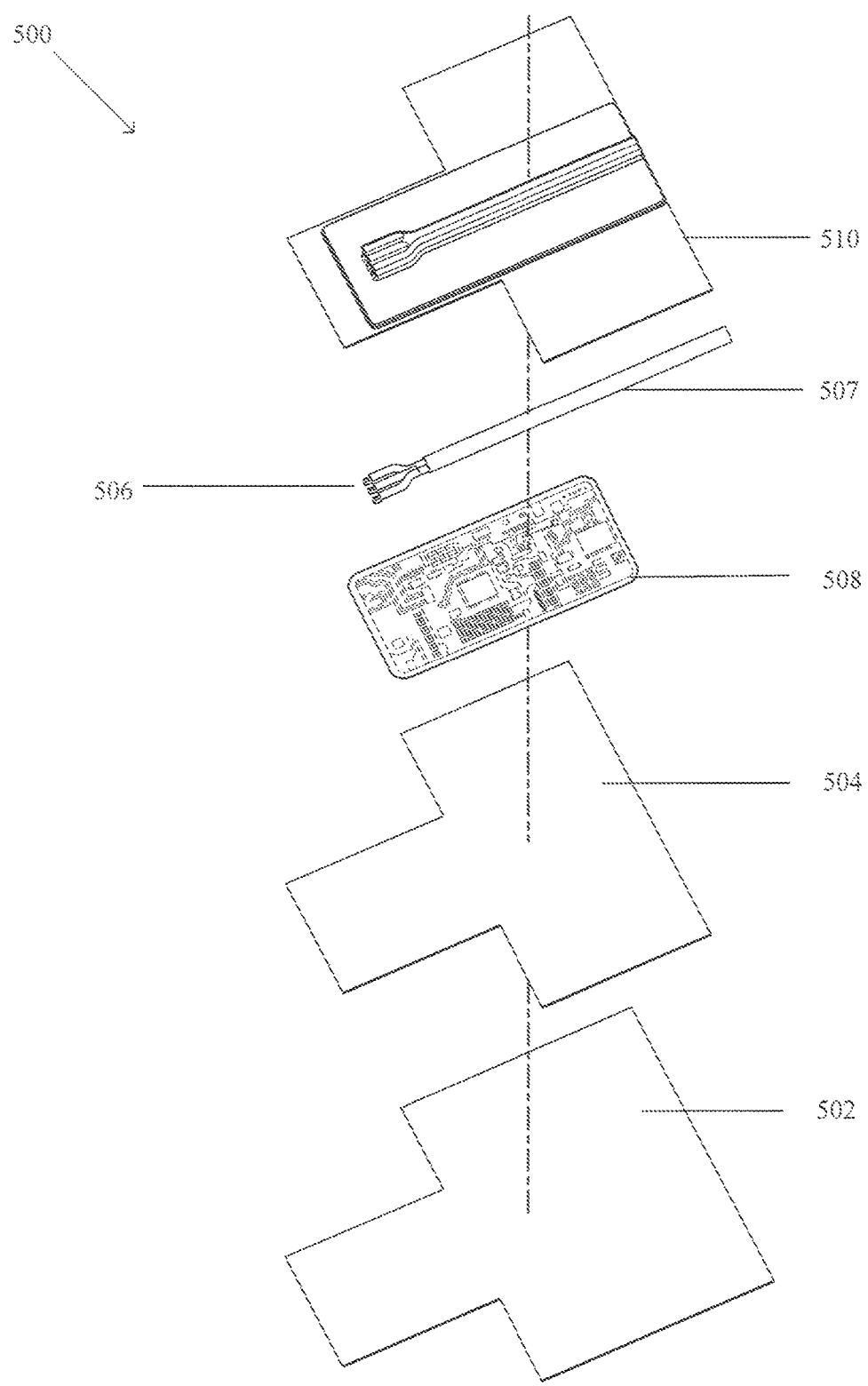
FIG. 5C: EXEMPLARY ALTERNATE FLEXIBLE CIRCUIT EXPLODED VIEW

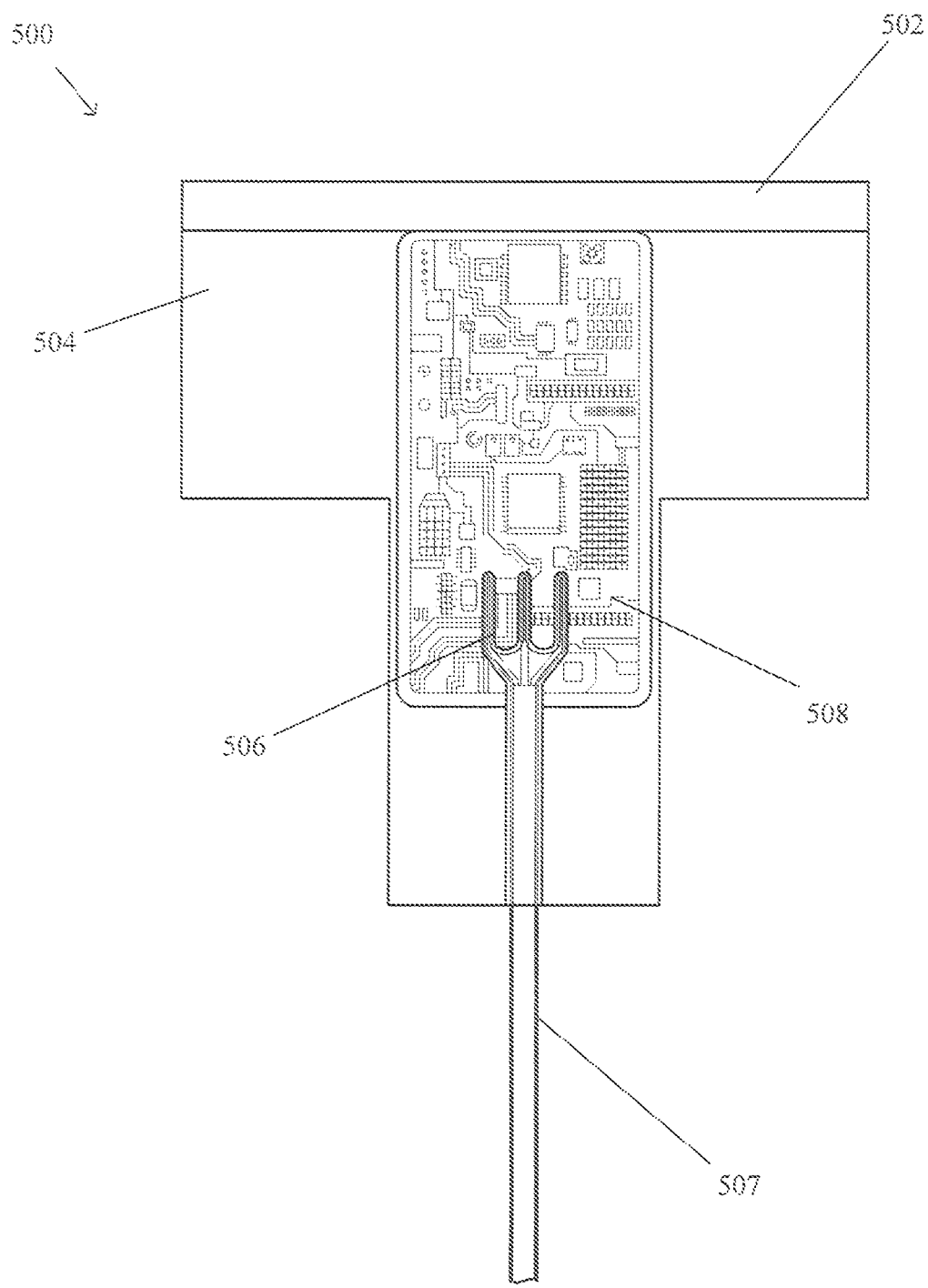
FIG. 5D: EXEMPLARY ADDITIONAL ALTERNATE FLEXIBLE CIRCUIT FRONT VIEW

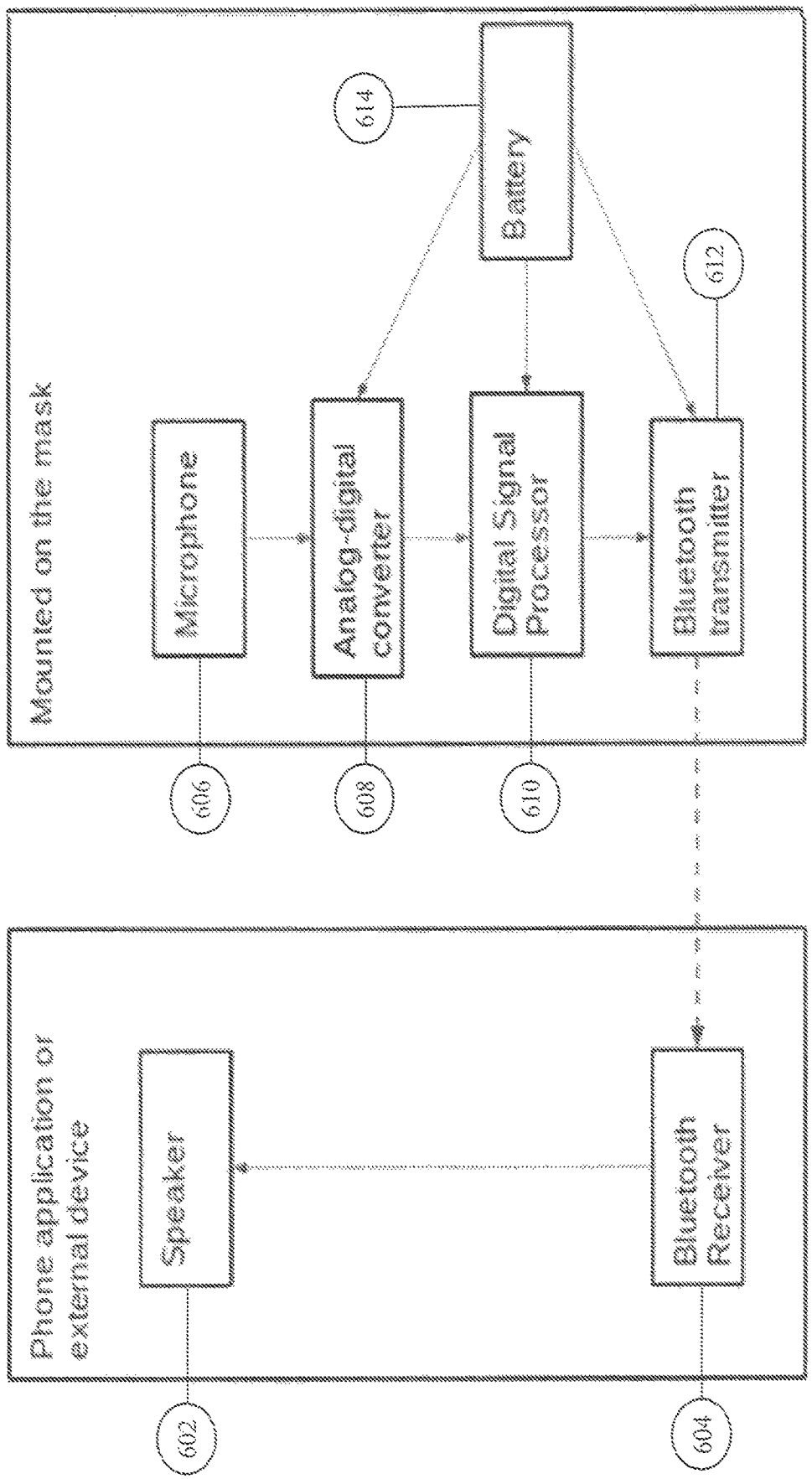
FIG. 6A: EXEMPLARY WIRELESS CONNECTIVITY DIAGRAM

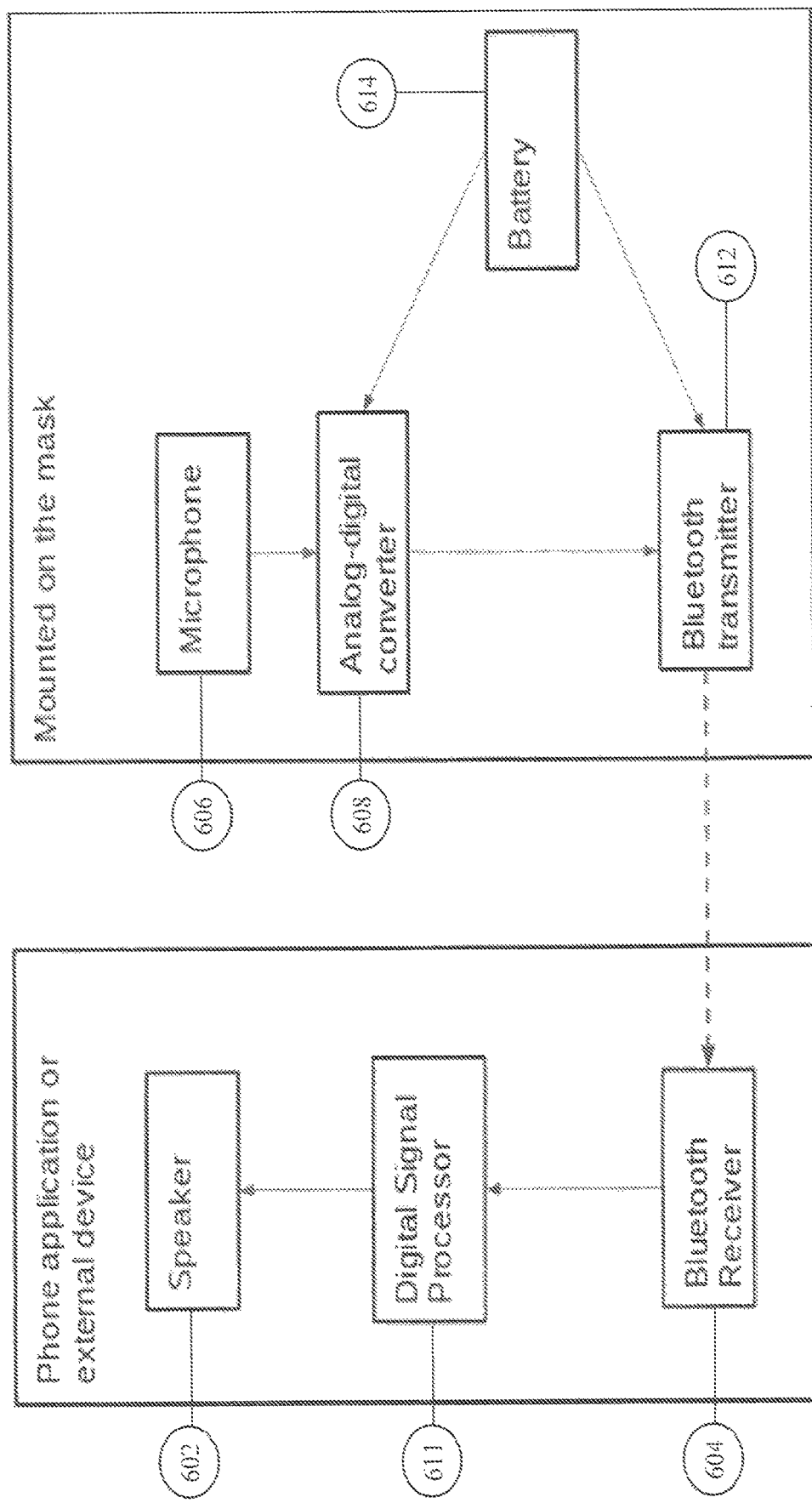
FIG. 6B: ALTERNATE EXEMPLARY WIRELESS CONNECTIVITY DIAGRAM

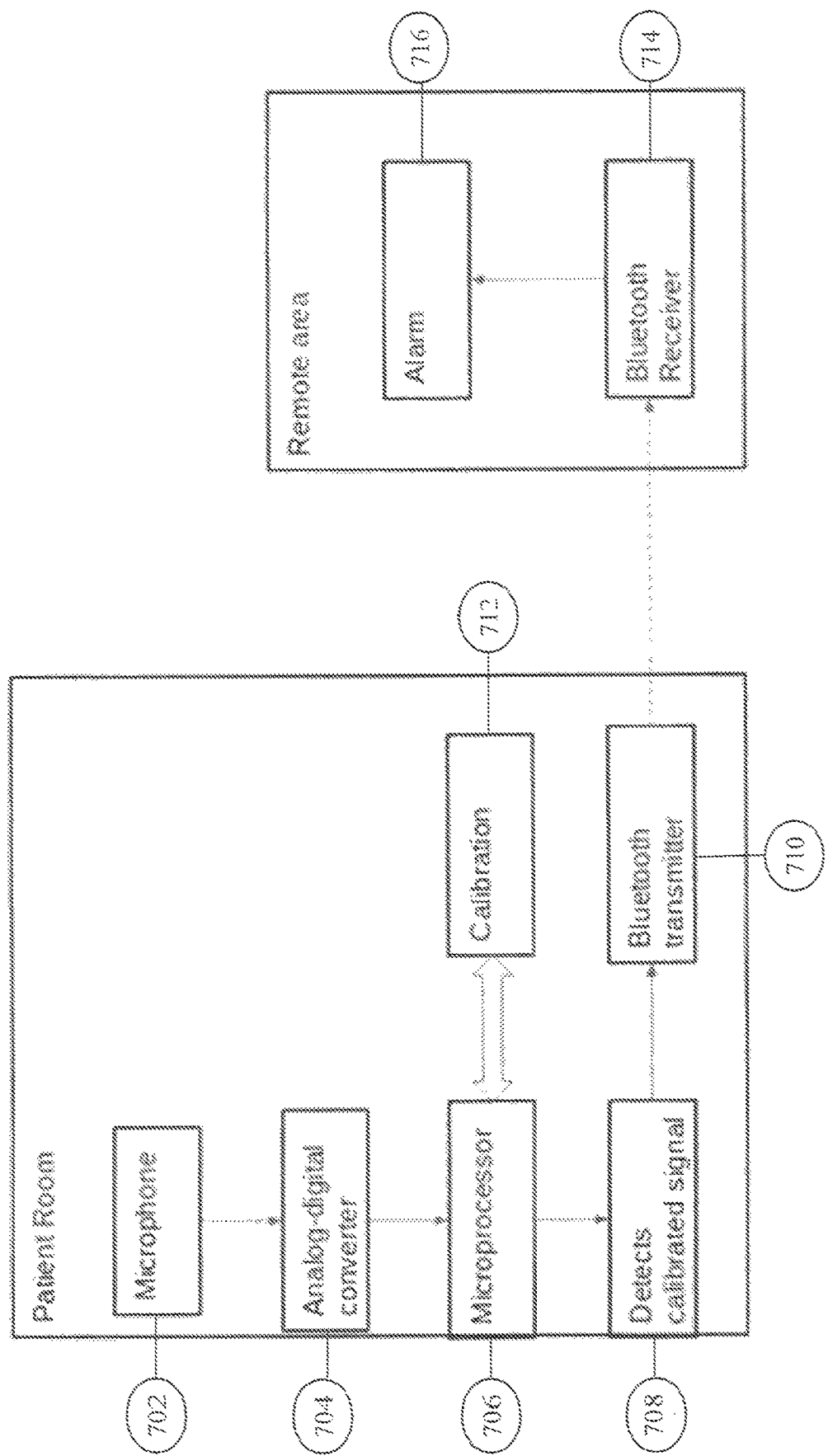
FIG. 7: EXEMPLARY RECORDING AND ALARM FEATURE DIAGRAM

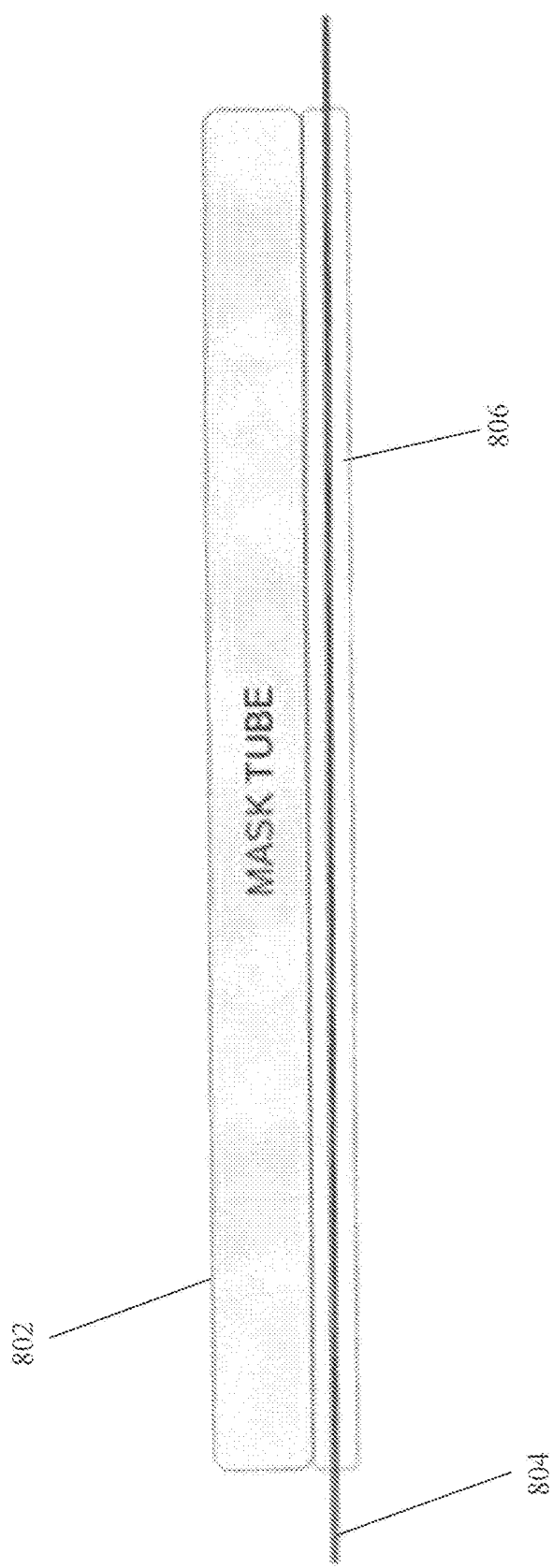
FIG. 8: EXEMPLARY WIRE TO TUBE ATTACHMENT SIDE VIEW

SYSTEMS AND METHODS FOR COMMUNICATING THROUGH A HARD PLASTIC MASK

CROSS REFERENCE TO RELATED APPLICATIONS

This application is a continuation of U.S. patent application Ser. No. 15/961,509, filed Apr. 24, 2018, entitled "SYSTEMS AND METHODS FOR COMMUNICATING THROUGH A HARD PLASTIC MASK," which claims priority to, the benefit under 35 U.S.C. § 119 of, and incorporates by reference herein in their entireties U.S. Provisional Patent Application No. 62/572,023, filed Oct. 13, 2017, entitled "Communication System for Hard Plastic Masks," and U.S. Provisional Patent Application No. 62/489,370, filed Apr. 24, 2017, entitled "Communication Device for Non-Invasive Ventilation Masks."

TECHNICAL FIELD

The present systems and methods relate generally to communicating through a hard plastic mask.

BACKGROUND

Currently, in critical care settings, patients that experience acute respiratory distress are prescribed noninvasive ventilation ("NIV"). This form of ventilation keeps the patient conscious, and a hard plastic mask is placed over their nose and mouth supplying positive pressure to the patient's respiratory system to aid in their breathing. Due to the fragility of the patient's state, the patient cannot remove the mask without risk of severe and immediate complications. This may lead to a patient who is completely unable to communicate with the outside world because of the sound barrier created by the hard plastic mask.

The communication barrier may create a host of problems. In many cases, a medical professional's best means of coming to a quick and accurate diagnosis is to be able to understand the patient's medical history, which is typically communicated to them by the patient or a family member of the patient. However, without a family member present and the patient wearing a mask, a doctor or nurse may not be able to get this vital information. The patient also may experience feelings of claustrophobia and isolation, causing them to try and remove the mask. This may lead to less effective treatment because medical professionals may have to correct the patient's treatment multiple times.

Currently, patients may communicate medical history and complaints to the medical staff by using communication boards. These boards have two to three dozen pictures, which are sometimes unlabeled, and an alphabet so that the patient typically can point to the most applicable picture or spell out a customized message. With NIV becoming more common, there is a long-felt but unresolved need for a system or method that can facilitate a more effective and natural means of patient communication with the outside world through a hard plastic mask.

BRIEF SUMMARY OF THE DISCLOSURE

Briefly described, and according to one embodiment, aspects of the present disclosure generally relate to systems and methods for recognizing speech vibrations through hard plastic masks, filtering out non-human voice related noise, and outputting the resulting speech of the mask wearer.

In various embodiments, the broad purpose of the systems and methods disclosed herein is to allow patients that are required to wear hard plastic masks, such as CPAP/BiPAP® masks, to be able to talk to the outside world without taking off the mask or inhibiting the current therapy that the mask is supplying. Many aspects of the present systems and methods include several components. In a particular embodiment, the system includes 1) a microphone element (e.g., piezoelectric element) that can be integrated with the mask during or after production of the mask, and either within or on the outside of the material of the mask; 2) a system for amplifying a signal received from the microphone (e.g., piezoelectric) element through a wired or wireless connection; 3) a connection to a built-in speaker system (the speaker system may be external to an amplification system) or to a database. As will be understood from discussions herein, the wired signal can be transmitted a number of ways, many of which may require interaction of the wire with the tube supplying treatment to the mask.

According to particular embodiments, a system including a flexible patch for facilitating voice communication through a mask, the flexible patch includes: A) a base that is substantially T-shaped and has a thickness of between 49-401 μm, the base including a first width, a second width, and an adhesive portion for attaching the base to a mask, wherein the second width is greater than the first width; B) a flexible circuit operatively connected to the base, the flexible circuit including: 1) a piezoelectric element, the piezoelectric element for detecting vibrations of the mask through the base and converting the vibrations to data; 2) an electronic filter including a high pass filter for filtering the data to remove frequencies below about 300 Hz and a low pass filter for filtering the data to remove frequencies above about 3,000 Hz; and 3) at least one processor, the at least one processor: i) amplifies the data; and ii) transmits the data to a speaker for broadcasting the data as a representation of human voice; C) a flexible substrate element operatively attached to the base and covering the flexible circuit for protecting the flexible circuit from outside interference; and D) a wax paper layer covering the adhesive portion of the base and sized such that at least a portion of the wax paper layer extends beyond an edge of the base.

In particular embodiments, the system herein, wherein the flexible substrate element covers at least a portion of the base. In at least one embodiment, the system herein, wherein the flexible circuit is operatively connected to a power source. In some embodiments, the system herein, wherein the piezoelectric element converts the vibrations to analog data. According to one or more embodiments, the system herein, wherein the system includes an analog to digital converter for converting the analog data to digital data. According to some embodiments, the system herein, wherein the system includes a digital signal processor, the digital signal processor for manipulating the digital data prior to the digital data being transmitted to the speaker. In a particular embodiment, the system herein, wherein the digital signal processor is wirelessly connected to the flexible circuit.

According to one or more aspects, the system including a flexible patch for facilitating voice communication through a mask including: A) a base having a thickness of between 49-401 μm and including a first width, a second width, and an adhesive portion for attaching the base to a mask, wherein the second width is equal to or greater than the first width and the base is operatively connected to a flexible circuit; B) a piezoelectric element operatively connected to the flexible circuit, the piezoelectric element for detecting vibrations of the mask through the base and converting the vibrations to data; C) a flexible substrate element operatively attached to the base and covering at least a portion of the base, the flexible circuit, and the piezoelectric element for protecting the flexible circuit and the piezoelectric element from outside interference; D) a removable wax paper layer covering the adhesive portion of the base and sized such that at least a portion of the wax paper layer extends beyond an edge of the base; E) an electronic filter operatively connected to the flexible circuit, wherein the electronic filter filters the data to remove frequencies below about 300 Hz and above about 3,000 Hz; and F) at least one processor, the at least one processor: 1) amplifies the data; and 2) transmits the data to a speaker for broadcasting the data as a representation of human voice.

In at least one aspect, the system herein, wherein the piezoelectric element is integrated with the flexible circuit. In some aspects, the system herein, wherein the at least one processor is operatively connected to the flexible circuit via a wire. In one or more aspects, the system herein, wherein the at least one processor is integrated with the flexible circuit. In some aspects, the system herein, wherein the base is substantially T-shaped. In at least one aspect, the system herein, wherein the piezoelectric element converts the vibrations to analog data. In various aspects, the system herein, wherein the system includes an analog to digital converter for converting the analog data to digital data. In certain aspects, the system herein, wherein the at least one processor is operatively connected to the flexible circuit via a wireless radio. In one or more aspects, the system herein, wherein the wireless radio includes a Bluetooth device. In some aspects, the system herein, wherein the wireless radio is operatively connected to an alarm. In one or more aspects, the system herein, wherein the system includes a band pass filter for filtering the digital data. In at least one aspect, the system herein, wherein the band pass filter includes a high pass filter and a low pass filter. In various aspects, the system herein, wherein the high pass filter and low pass filter the digital data to remove frequencies below about 350 Hz and above about 2,500 Hz.

These and other aspects, features, and benefits of the claimed invention(s) will become apparent from the following detailed written description of the preferred embodiments and aspects taken in conjunction with the following drawings, although variations and modifications thereto may be effected without departing from the spirit and scope of the novel concepts of the disclosure.

BRIEF DESCRIPTION OF THE DRAWINGS

The accompanying drawings illustrate one or more embodiments and/or aspects of the disclosure and, together with the written description, serve to explain the principles of the disclosure. Wherever possible, the same reference numbers are used throughout the drawings to refer to the same or like elements of an embodiment, and wherein:

FIG. 1 illustrates an exemplary system environment, according to one embodiment of the present disclosure.

FIG. 2 illustrates an exemplary system component diagram, according to one embodiment of the present disclosure.

FIG. 3A is a side view of an exemplary method of attaching a piezoelectric element to a mask, according to one embodiment of the present disclosure.

FIG. 3B is a side view of an exemplary method of attaching a piezoelectric element to a mask, according to one embodiment of the present disclosure.

FIG. 3C is a side view of an exemplary method of attaching a piezoelectric element to a mask, according to one embodiment of the present disclosure.

FIG. 5A is a front view of an alternate exemplary patch, according to one embodiment of the present disclosure.

FIG. 5B is a side view of an alternate exemplary patch, according to one embodiment of the present disclosure.

FIG. 5C is an exploded view of an alternate exemplary patch, according to one embodiment of the present disclosure.

FIG. 5D is a front view of an additional alternate exemplary patch, according to one embodiment of the present disclosure.

FIG. 6A is an exemplary wireless connectivity diagram, according to one embodiment of the present disclosure.

FIG. 6B is an alternate exemplary wireless connectivity diagram, according to one embodiment of the present disclosure.

FIG. 7 is an exemplary recording and alarm feature diagram, according to one embodiment of the present disclosure.

FIG. 8 is a side view of an exemplary wire to tube attachment, according to one embodiment of the present disclosure.

DETAILED DESCRIPTION

Figure 4A:
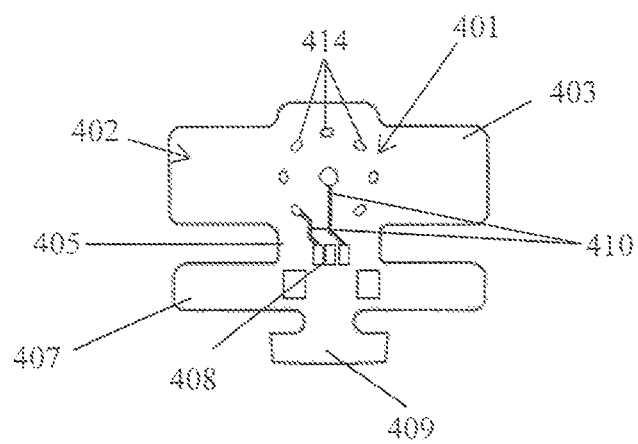
FIG. 4A is a front view of an exemplary patch without a microphone attached, according to one embodiment of the present disclosure.

For the purpose of promoting an understanding of the principles of the present disclosure, reference will now be made to the embodiments illustrated in the drawings and specific language will be used to describe the same. It will, nevertheless, be understood that no limitation of the scope of the disclosure is thereby intended; any alterations and further modifications of the described or illustrated embodiments, and any further applications of the principles of the disclosure as illustrated therein are contemplated as would normally occur to one skilled in the art to which the disclosure relates. All limitations of scope should be determined in accordance with and as expressed in the claims.

Whether a term is capitalized is not considered definitive or limiting of the meaning of a term. As used in this document, a capitalized term shall have the same meaning as an uncapitalized term, unless the context of the usage specifically indicates that a more restrictive meaning for the capitalized term is intended. However, the capitalization or lack thereof within the remainder of this document is not intended to be necessarily limiting unless the context clearly indicates that such limitation is intended.

Overview

Aspects of the present disclosure generally relate to a system for communicating through a hard plastic mask, and more particularly to systems and methods for recognizing speech vibrations through CPAP/BiPAP® masks, filtering out non-human voice related noise, and outputting the resulting speech of the mask wearer. In various embodiments, the system includes a patch, the patch including a flexible circuit operatively connected to a vibrational energy transducer (e.g., piezoelectric transducer) to receive voice input from humans.

In certain embodiments, the system includes a signal filtration system to separate human voice from noise. In some embodiments, the signal filtration system includes a low pass filter. In particular embodiments, the signal filtration system includes a high pass filter. In at least one embodiment, the signal filtration system includes an analog-to-digital converter. In one or more embodiments, the signal filtration system includes a digital signal processor. In some embodiments, the flexible circuit includes an amplification unit for increased intelligibility.

Additionally, according to at least one embodiment, the system includes a power source for providing power to the different system components. In at least one embodiment, the system includes a flexible substrate (e.g., tape) for encasing the microphone element and, in some embodiments, the flexible circuit. In one embodiment, the system includes a plastic housing for encasing the microphone (e.g., piezoelectric) element.

In certain embodiments, the patch includes wires for operatively connecting the different system components, including, for example, the flexible circuit and/or microphone element to other portions of the system. In particular embodiments, the wires may be attached to a mask tube that supplies a patient with oxygen and medicine. In some embodiments, the wires may be attached to the mask tube with an adhesive.

Furthermore, in various embodiments, aspects of the present disclosure are related to a mechanism for outputting discernable human voice. In some embodiments, the output mechanism is a speaker or audio jack (e.g., for connecting headphones, a speaker, or the like). In particular embodiments, the output mechanism is a wireless radio connection, such as a Bluetooth device. In one embodiment, the output mechanism includes a calibration device to detect key words. In at least one embodiment, the calibration device includes a microprocessor to facilitate identification and separation of key words. In various embodiments, the system includes an alarm for providing notification when a key word is detected.

Exemplary Embodiments

Turning now to FIG. 1, an exemplary system environment 100 is shown, according to one embodiment of the present disclosure. In particular embodiments, and as mentioned briefly above, the exemplary system environment includes a patch 104 for converting vibrational energy into an AC electrical signal. In some embodiments, and as will be further described herein, the patch 104 is attached to the outside of a CPAP/BiPAP® mask 102. In particular embodiments, the patch 104 is attached to the inside of the CPAP/BiPAP® mask. In at least one embodiment, the patch 104 is embedded within the CPAP/BiPAP® mask 102. As will be understood from discussions herein, the patch 104 may include a microphone element, a flexible circuit, and various other components for converting vibrations (e.g., human voice behind the mask) to speech.

According to various aspects of the present disclosure, the exemplary system environment 100 includes an amplification unit 110 (also referred to herein as "amplifier") operatively connected to the patch 104 via a wire 112. In particular embodiments, the wire may be between 8 gauges and 20 gauges, or any other suitable size. In some embodiments, the wire 112 is a triplex wire. In another embodiment, the wire 112 may be a main feeder wire, a panel feed wire, a single strand wire, a non-metallic sheathed wire, or any other suitable type of wire. In at least one embodiment, the system is configured wirelessly and does not include a wire 112.

In particular embodiments, the exemplary system environment 100 includes a power source 106 operatively connected to the system via a wire 108 to generate the necessary current to power various components of the system. In various embodiments, the power source 106 may be battery power. In certain embodiments, the power source may be outlet power. In these embodiments, the device may require additional conditioning of power to convert from AC/DC power and optimize the voltage. In these embodiments, the AC current is changed to DC current using a power supply AC/DC converter. In at least one embodiment, the power source 106 may be both battery power and outlet power.

According to particular embodiments, a −5V voltage regulator is used in order to obtain a 0V bias on the piezoelectric element, by applying the −5V offset to the system. This may allow the piezoelectric element's AC signal to be measured and amplified by the system without floating the element at a positive voltage. In some embodiments, the voltage of the offset is dependent on the power supply of the system, which is dependent on the voltage required by the integrated circuits. As will be understood, the voltages may not need to be equal and opposite.

Turning now to FIG. 2, an exemplary system component diagram is shown, according to one embodiment of the present disclosure. The exemplary diagram begins at step 202 where the system receives a vibration signal. The system is configured to receive a vibration signal from any suitable mechanism of communication, including but not limited to, human voice communication.

In one embodiment, a wire carries an signal (e.g., data) from a piezoelectric transducer (included with the patch 104 in FIG. 1), to a filtration system. In this embodiment, the filtration system uses a series of integrated circuits or a processor to create one or more bandwidth filters. Generally, in at least one embodiment, the system is configured to remove frequencies outside of the frequency range of a typically human voice (e.g., to isolate frequencies within the human voice frequency range). As will be understood, the human voice ordinarily has a long term frequency range between about 250 Hz to 4,000 Hz. In various embodiments, the system is configured to receive and process signals between about 10 Hz and 20,000 Hz and to filter out frequencies above or below a typical human voice range (e.g., approximately 250 Hz to 4,000 Hz).

For example, and as shown in FIG. 2, at step 202 the system receives a vibration signal, such as a high profile noise found at about 5,000 Hz. At step 204, the vibration signal received at step 202 passes through an initial bandpass filter. As will be understood, a bandpass filter includes a high noise filter and a low noise filter. Continuing with the current example, the bandpass filter may be used to filter out any noise below about 250 and 500 Hz. At step 206, the vibration signal passes through another bandpass filter such that any noise above about 2,000 and 4,000 Hz is filtered out of the system and distinguishable speech can still be output without noise.

In various embodiments, the filtration ranges may be reversed such that the first filter removes noise above about 2,000 and 4,000 Hz, and the second filter removes noise below about 250 and 500 Hz. In at least one embodiment, the combination of bandpass filters provides frequency cutoffs at 300 Hz and 3,000 Hz with a slope of at least 40

DB/decade. In particular embodiments, due to the design of the filters there is an inherent gain of the signal from 10×-100× per filtration stage.

In some embodiments (not shown), if high noise is found in the lower frequency ranges (where wind noise is commonly found), the higher frequency noises can be removed using up to a 250 Hz-500 Hz cutoff frequency bandpass filter, which may allow for a higher amplification of the low frequency voice elements, as the low frequency filtration system will have less high noise to filter out. In one embodiment, a 1,000 Hz to 1,500 Hz bandpass filters may be used. In another embodiment, a 2,500 Hz to 3,000 Hz bandpass filter may be used.

As will be understood from discussions herein, the system may include digital or analog filtering (or amplifying) components. In one or more embodiments, the system include a series of bandpass filters as discussed above (e.g., for filtering analog data). In at least one embodiment, the system includes a digital element/circuit (which may or may not include a processor) for filtering and/or amplifying digital data. In further embodiments, the system includes an electrical circuit for amplifying analog data (e.g., the amplifier is a physical component). In still further embodiments, the system includes at least one processor for amplifying digital data (e.g., the amplifier and amplification functionality is carried out by at least one processor).

Continuing with FIG. 2, at step 208 the system outputs the filtered signal. In various embodiments, the system may output the filtered signal wirelessly (e.g., Bluetooth, Wi-Fi, ZigBee etc.). According to particular embodiments, the system outputs the filtered signal via a wired connection.

In some embodiments, the system is configured to amplify the filtered signal, where the amplification of the signal is dependent on the quality of speaker that is used. As will be understood, while there is a minimum amplification to gain the raw signal from 25-50 mV to the standard 2.89 V, additional amplification may be employed to overcome speaker woofer inadequacies.

In particular embodiments (not shown), the system includes three stages of integrated circuits, two of which have a fixed gain and whose main purpose is to filter the signal. In these embodiments, the third integrated circuit is used in combination with a potentiometer to create a variable gain and to control the volume of the audio output. In some embodiments, the output of the circuit has two audio outputs: one to a built-in loudspeaker, and another to an output for allowing external sound systems to accept the output audio signal such that the signal can be shared and heard via multiple devices. In particular embodiments, this portion of the circuitry can be completed in a single stage by combining it into a single stage bandpass filter with a variable gain. In some embodiments, the device can also be made with multiple stages, with redundant filtering to improve the slope and character of the filters.

Referring now to FIG. 3 (including FIGS. 3A-3C), side views of exemplary methods of attaching a patch (e.g., patch 104 shown in FIG. 1) to a mask 102 are shown, according to one embodiment of the present disclosure. In various embodiments, the patch, including microphone element (e.g., the piezoelectric transducer) 302, can be attached to the mask 102 by many different methods. In some embodiments, the only limiting factor is that the face of the microphone element 302 should create sufficient contact with the material of the mask 102 to receive vibrations when a person wearing the mask speaks.

In the embodiment shown in FIG. 3A, the system 301 includes a patch, including a microphone element 302 attached to a mask 102 via a flexible single-sided adhesive system that houses the microphone element so that the patch is adhered to the mask 102. In this embodiment, contact is made between the microphone element and the mask surface. In these embodiments, a housing (e.g., flexible substrate) of the patch 302 insulates the exterior connections of the microphone element, protects the microphone element 302 from unnecessary mechanical stresses that would put the microphone element at risk, and gives a mechanism of attaching the microphone element to the mask 102.

Continuing with FIG. 3A, in a first embodiment, the patch includes two pieces of single sided tape where adhesive sides of the tape face the same direction and sandwich the microphone element between the two pieces of single-sided tape, so the signal accepting side of the microphone element faces the side of the system where the adhesive faces outwards. In this first embodiment, the adhesive side of the tape system will then be used to attach the microphone element to the mask 102. In this embodiment, wire(s) 304 run from the signal output side of the microphone element.

In a second embodiment, the system includes Kapton®, and there is a solder spot to allow wires 304 to easily attach to the Kapton® portion of the system to carry the microphone element signal from the microphone element to the other parts of the system. In these embodiments, the adhesive side of the Kapton® includes concentric circles terminals, where one concentric circle is positive and the other is negative. In this embodiment, a piezoelectric transducer with an exposed circular brass ring is attached to these terminals with the signal receiving side facing outwards.

In particular embodiments, the patch 302 includes a flexible circuit that can be made either by traditional flex printed circuit board (PCB) methods or by a less traditional layering method. In some embodiments, the layering method involves a four layer system. In this embodiment (and others), the first layer attaches directly to the mask 102 and the fourth layer is the farthest away from the mask 102. Continuing with this embodiment, the first layer is a Kapton® film with a hole at least the diameter of the microphone element. The second layer, in this embodiment, is a single side of conductor coated Kapton® layer with the conductor layer facing towards the first layer. Continuing with this embodiment, the second layer defines an opening that is at least the diameter of the inner diameter of exposed brass on the microphone element, and at most equal to the outer diameter of the element. In this embodiment, the third layer is made of a Kapton® film, which may or may not have a solder-phobic coating to ensure separation of the positive and negative connections made to the microphone element. This layer may have a hole that is about the diameter of the ceramic center of the microphone element. Further continuing with this embodiment, the fourth layer is made of a conductor coated Kapton® sheet with no hole. As will be understood from discussions herein, the second layer and fourth layer, in this embodiment, act as the negative and positive terminals (e.g., there is one positive and one negative terminal).

Further, in the embodiment discussed above (and others), the series of holes in the Kapton® layers are concentric, but do not necessarily need to be circular just as long as the profile of the holes creates a clear positive and negative connection with the microphone element with an area of segregation. Continuing with this embodiment, the microphone element is adhered to the layers in the series of holes, with the signal receiving side facing outward, and the copper sheets carrying the signal to terminals of a wire 304.

In the embodiment shown in FIG. 3B, the system 303 includes a contact area of a microphone element that is permanently attached to a mask using a high viscosity adhesive 306, such as an epoxy, to completely incase the microphone. In these embodiments, the adhesive 306 is hard enough to transmit vibration (e.g. epoxy putty, two stage epoxy, single stage epoxy, polyurethanes, emulsion adhesives). In at least one embodiment, the mask and microphone assembly is produced as a single unit.

In the embodiment shown in FIG. 3C, the system 305 includes a patch (e.g., including a piezoelectric transducer and a flexible circuit) 302 encased in a mask 102, either by post-manufacturing modification or during the molding of the mask. In these embodiments, the system does not include adhesives or the like.

In one embodiment, the patch 302 is suspended in the material of the mask parallel or near parallel to the surface of the material. In at least one embodiment, the material of the mask is silicone. In particular embodiments, a circular recessed area is designed in either the mold of the mask 102 or is added via post processing into the mask, and is at least the diameter and the thickness of the patch 302. In this embodiment, the microphone is placed in the recessed area. In various embodiments, the leads of the patch 302 protrude from the convex side of the mask 102.

Figure 4B:
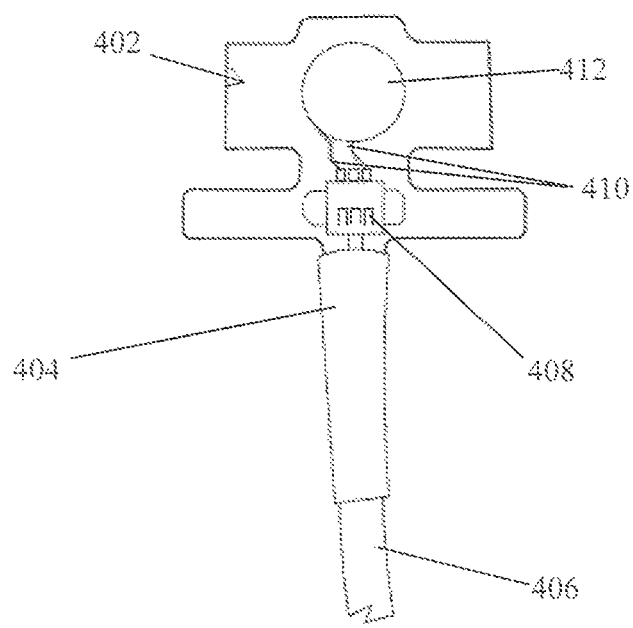
FIG. 4B is a front view of an exemplary patch with a microphone attached, according to one embodiment of the present disclosure.
Figure 4C:
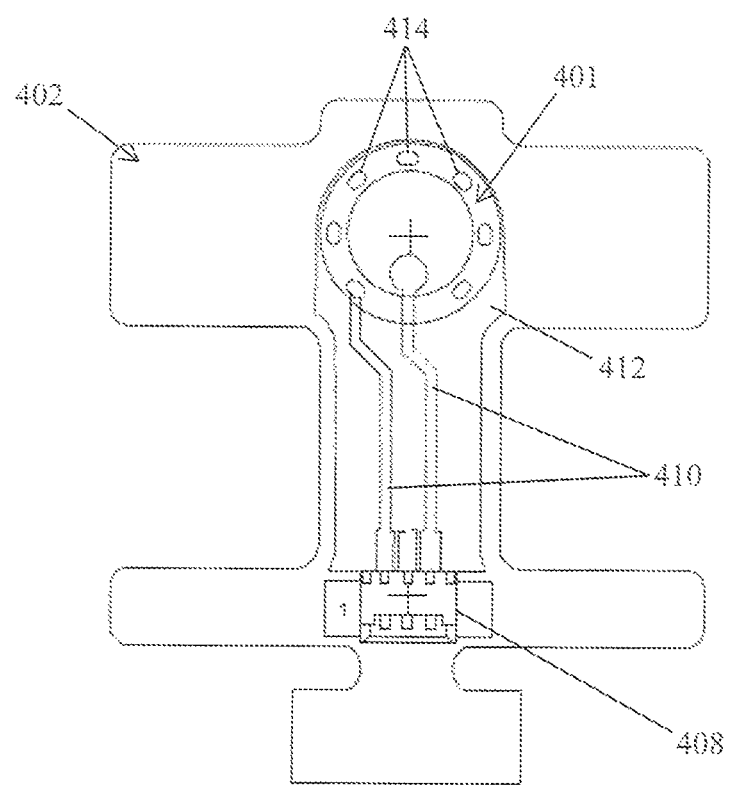
FIG. 4C is a front view of an exemplary patch with a microphone attached, according to one embodiment of the present disclosure.

FIG. 4 (including FIGS. 4A-4C) shows front views of exemplary patches, according to one embodiment of the present disclosure. Generally, FIG. 4A includes a front view of a patch without a microphone attached, FIG. 4B includes a front view of a patch with a microphone attached, and FIG. 4C includes a front view of a patch with a microphone attached showing the connections between the microphone and the flexible circuit.

In particular embodiments, the patch 402 has a base with a width between 10 mm and 50 mm, a height between 12 mm and 100 mm, and a thickness between 50 µm and 400 µm. In one embodiment, the patch has a width of approximately 20 mm, a height of approximately 35 mm, and a thickness of approximately 50 µm. In another embodiment, the patch has a width of approximately 30 mm, a height of approximately 50 mm, and thickness of approximately 200 µm. In yet another embodiment, the patch 402 has a width of approximately 50 mm, a height of approximately 100 mm, and thickness of approximately 400 µm. In various embodiments, the patch has a width greater than 50 mm. In some embodiments, the patch has a width less than 10 mm. In particular embodiments, the patch 402 has a thickness greater than 400 µm. In at least one embodiment, the patch has a thickness less than 50 µm.

In various embodiments, the patch 402 is T-shaped. In some embodiments, the patch is rectangular in shape. In particular embodiments, the patch may be circular, or any other suitable shape. In at least one embodiment, the patch 402 is I-shaped, such that the upper horizontal region 403 is substantially wider than the lower horizontal region 407 and the upper horizontal region may include a microphone element. In these embodiments, a vertical region 405 is included between the upper horizontal region 403 and lower horizontal region 407, such that the vertical region 405 is substantially more narrow than the upper and lower horizontal regions. These embodiments allow the patch to maintain maximum contact with a mask, and provide greater stability and load distribution when attached to a mask. In certain embodiments, a bottom horizontal region 409 is included below the lower horizontal region 407 that may provide additional support for cabling extended below and beyond the patch.

In the embodiment shown in FIG. 4A, outputs of at least positive, negative, and ground are available for wires to carry a signal from the microphone to an amplifier unit. In some embodiments, a flexible circuit 401 includes a circular pattern of adhesive and conductors 414, or a circular pattern of conductive adhesive. In these embodiments, either pattern is connected by conductive pathways 410 through the vertical portion 405 to the positive or negative terminals 408. In particular embodiments, a conductive adhesive, conductive terminal, or a combination of conductive adhesive and a conductive terminal, is within the area of the circle of conduction 414 described above. In these embodiments, the conductive terminal is connected via a flexible conductive pathway 410 to the positive or negative output 408.

In the embodiment shown in FIG. 4B, a microphone element (e.g., piezoelectric element) 412 is attached to the flexible circuit. In this embodiment, the system includes a wiring enclosure 404, which, in some embodiments, is coated on the underside with adhesive, and contains wiring with leads 406 protruding out from the assembly for connecting the microhone element (e.g., piezoelectric element) 412 to external equipment (e.g., speaker, audio jack, monitor, etc.).

FIG. 4C shows a front view of an exemplary patch 402 with a piezoelectric element attached to the flexible circuit 401, according to one embodiment of the present disclosure. In the embodiment shown, a transparent piezoelectric element is connected to the flexible circuit 401, such that the underlying components are shown. In this embodiment, the underlying components include a circular pattern of adhesive and conductors 414 connected to a positive or negative output 408 via a conductive pathway 410.

According to at least one embodiment (not shown), the system includes a flexible substrate (e.g., tape) or plastic housing, or similar plastic mold, for housing the microphone (e.g., piezoelectric) element. In this embodiment, the piezoelectric element is installed either pressed up against the inner wall closest to the signal source, or has an opening where the element can create direct contact with the signal source.

In certain embodiments (not shown), a flexible adhesive sleeve is used to house the microphone (e.g., piezoelectric) element. In these embodiments, the microphone element is housed between two sheets of thin flexible polymers with adhesive on at least one side. In particular embodiments, the adhesive adheres to the outside of the mask and may be protected until use by a protective non-adhesive sheet, including, but not limited to, wax paper.

FIG. 5A illustrates a front view of an alternate exemplary patch 500, according to one embodiment of the present disclosure. In various embodiments, a double-sided adhesive layer 504 (sometimes referred to herein as "base") attaches the flexible circuit 508 (which, in some embodiments, includes a microphone element) to the mask using the outside layer of adhesive. In particular embodiments, the double-sided adhesive layer is T-shaped to facilitate a secure attachment to the mask. In one embodiment, the double-sided adhesive layer is rectangular in shape. In another embodiment, the double-sided adhesive layer may be circular, or any other suitable shape. In these embodiments, the inside layer of adhesive holds the flexible circuit 508 and the protective layer (not shown) in place. In various embodiments, wiring 506 is enclosed in a wiring sheath 507 and is connected to the flexible circuit 508 to facilitate external connections. In at least one embodiment, the wiring sheath extends downward towards and beyond the substantially horizontal portion of the T-shaped double-sided adhesive layer 504.

Continuing with the embodiment shown in FIG. 5A, a removable protective layer 502 is included at the bottom of the device 500 to protect the double-sided adhesive layer prior to the device being attached to a mask. In various embodiments, the removable protective layer 502 is a wax paper layer and is larger in size than the layer of double-sided adhesive 504. In particular embodiments, the removable protective layer 502 is substantially identical in size to the double-sided adhesive layer. In at least one embodiment, the removable protective layer 502 is cut in substantially the same shape as the double-sided adhesive layer 504. In some embodiments, the removable protective layer is in a substantially different shape than the shape of the double-sided adhesive layer.

Turning now to FIG. 5B, a side view of the alternate exemplary patch 500 is shown, according to one embodiment of the present disclosure. In various embodiments, a protective layer 510 may be included to insulate the flexible circuit (flexible circuit, microphone 508 and wiring 506) from outside interference, and to secure the wiring 506 and solder points in the event that a pulling force is applied to the wiring sheath 507 or another part of the apparatus. In one embodiment, the protective layer 510 is substantially identical in size and shape to the double-sided adhesive layer 504 such that it may fit securely on top of the double-sided adhesive layer. In at least one embodiment, the protective layer 510 may be formed from plastic or any suitable material. In a particular embodiment, the protective layer 510 may include one or more recesses for receiving the flexible circuit 508, wiring 506, or other components of the system. In at least one embodiment, the protective layer 510 includes a flexible substrate, such as a form of tape.

FIG. 5C shows an exploded view of the alternate exemplary patch 500, illustrating the way in which various components are connected. In one embodiment, FIG. 5C shows the protective layer 510, the circuitry 508, the wiring 506, and the wiring sheath 507. Additionally, FIG. 5C demonstrates the positioning of the double-sided adhesive layer 504 with respect to the oversized removable protective layer 502. Generally, the number of elements (e.g., removable protective layer 502, flexible circuit 508, protective layer 510, etc.), orientation of those elements, and composition of those elements as shown in FIG. 5C are for exemplary purposes only. As shown in FIG. 5C, the removable protective layer 502 attaches to the double-sided adhesive layer 504, which attaches to the flexible circuit 508, which attaches to the wiring 506 enclosed in wiring sheath 507, which attaches to the protective layer 510. As shown, the flexible circuit 508, the wiring (including leads) 506, and at least a portion of the wiring sheath 507 are enclosed between the protective layer 510 and the double-sided adhesive layer 504.

Now referring to FIG. 5D, a front view of an additional alternate exemplary patch 500 is shown, according to one embodiment of the present disclosure. In the embodiment shown, the wiring sheath 507 containing the wires 506 and connected to the flexible circuit 508 extends along and beyond the elongated vertical portion of the T-shaped double-sided adhesive layer 504. In this embodiment, the orientation of the removable protective layer 502 and the double-sided adhesive layer 504 facilitate alternate positioning of the device 500 on a hard plastic mask. Additionally, the orientation shown in this embodiment, allows for a more significant portion of the wiring sheath 507 containing the wires 506 to be secured under the protective layer 510, which further reduces the effects of stress placed on solder points by a pulled wiring sheath 507.

FIG. 6 (including FIGS. 6A and 6B) shows an exemplary wireless connectivity diagram, according to one embodiment of the present disclosure. Generally, FIGS. 6A and 6B show the signal transmission from a microphone 606 through a filter assembly. In various embodiments, the signal can be transmitted from the microphone 606 through the filter assembly in either a wired or wireless configuration. In particular embodiments, a wireless radio assembly includes an analog to digital converter 608, digital signal processor 610, Bluetooth transmitter 612, and battery 614 mounted on a mask 102 (e.g., a flexible circuit 508 shown in FIGS. 5A-5D). In these embodiments (and others) as shown in FIG. 6A, the Bluetooth transmitter transmits the signal received from the microphone 606 wirelessly to the speaker unit 602. In these embodiments, the signal may be filtered, amplified and converted from analog to digital prior to Bluetooth transmittal. In some embodiments, the Bluetooth transmitter 612 is class II strength allowing it to only transmit to a phone within a particular range (e.g., the same room) to avoid potential multiple device interference and privacy issues.

In the embodiment shown in FIG. 6B, the microphone signal received through a mask is digitally converted with an analog to digital converter 608, and passed to a Bluetooth transmitter 612 that may be located on the mask (e.g., a flexible circuit 508). In this embodiment, the Bluetooth transmitter passes the digital signal to a Bluetooth receiver 604 located on a smartphone or other external device. Continuing with this embodiment, the digital signal is then processed with a digital signal processor 611 for signal manipulation (e.g., encoding, decoding, controlling volume, etc.), and output through a speaker 602 or other output device. In this embodiment, the digital signal processor 611 is not included on the mask to reduce load on the system and increase battery life.

Additionally, Bluetooth enabled aspects of the present system may support smartphone compatibility. The typical smartphone may need an additional lightweight app in order to be used in a "slave" manner—code enabling the smartphone to sustain a RFCOMM connection. As will be understood, the code binds the device to an available RFCOMM socket, accepts the connection, and then outputs the signal to the built in speakers on the phone.

Turning now to FIG. 7, an exemplary recording and alarm feature diagram is shown, according to one embodiment of the present disclosure. In various embodiments, the system includes a microphone 702, an analog to digital converter 704, a microprocessor 706, and a Bluetooth transmitter 710. In particular embodiments, the system includes a Bluetooth receiver 714 and an alarm 716 in a remote monitoring area, such that a patient's verbal cues can trigger the alarm 716 and garner the attention of a member of the medical staff.

In one embodiment, the analog to digital converter 704 is operatively connected to the microphone 702. In this embodiment, the signal received from the microphone is fed into the microprocessor 706. The microprocessor 706, in this embodiment, has a read mode, activated by a tactile button on the device. In some embodiments, the read mode may be activated by any other suitable method (e.g., switch, voice command, etc.).

In various embodiments, the read mode listens and logs certain key words spoken by a mask wearer (e.g., "help," "hungry," "pain," etc.). Once activated, calibration 712 begins as the system is configured to listen for the key words separated by a pause. In one embodiment, the pause is used by the microprocessor 706 to differentiate between items during the calibration period 712. In various embodiments, the words said and repeated in the calibration period 712 may be recorded and stored in a library that compares three second clips of signal received from the microphone for similarities to items in the library. In some embodiments, the length of signal clips compared may be less than three seconds. In particular embodiments, the length of signal clips compared may be greater than three seconds. In some embodiments, the length of signal clips compared is any suitable length between 1 and 10 seconds (e.g., 2 seconds, 1-4 seconds, 5 seconds, etc.).

In certain embodiments, the library may be located on the device or may be located elsewhere (e.g., electronic medical records). In one embodiment, if there is a similarity in the signal and library entries, the system is configured to detect a calibrated signal, and send a warning via Bluetooth class I transmitter 710 (which has a range of 100 m) to a connected unit with a Bluetooth receiver 714 at a nurse station described herein, or other location. In at least one embodiment, the warning triggers an alarm 716 to ring. In these embodiments, the system is configured to continue to send this signal periodically, and the alarm 716 will continue to ring until a stop alarm button is pressed on the device, or other indication is given.

In one example (not shown), a nurse station includes a box with a speaker, light, and Bluetooth class I receiver, with capabilities to connect to multiple devices through an array. Continuing with this example, the receiver is always on and listening (e.g., periodically), and when a signal comes in from one of the devices in a patient's room, the signal is played through the speaker. This signal can be an alarm, a patient's voice, flashing lights, or other signaling mechanism. Continuing with this example, an array of lights indicates which Bluetooth transmitter is sending the message, and from what room the alert signal is coming. In at least one embodiment, there may be a digital to analog converter from the Bluetooth transmitter to the speaker to allow direct signal output.

Referring now to FIG. 8, a side view of an exemplary wire to tube attachment is shown, according to one embodiment of the present disclosure. In embodiments where the system includes a wired connection from the microphone to the other components of the system, it may be advantageous to integrate the wire(s) 804 with tube(s) 802 coming off of the mask designed to supply a patient with oxygen or medicine. As such, in one embodiment, when a patient moves in their bed, the patient does not become tangled in the tube 802 and wire 804, potentially injuring themselves.

In particular embodiments, the wire 804 may be encased in plastic or another suitable material 806 (e.g., via lamination or the like). In these embodiments, the wire 804 may be operatively connected to the tube 802 by adhesive, heat shrink, or other methods of attachment. In some embodiments, the system includes a double layer polymer tube where the wire 804 is integrated between the two polymer layers. In these embodiments, the wire 804 will protrude from both ends: one with the microphone assembly and the other with a connector meant to connect to the speaker system.

In one embodiment (not shown), the microphone element is connected to the tube by using at least one clip. In some embodiments, the clip is substantially circular and approximately the size of the tube with a gap slightly smaller than the outer diameter of the tube so that the tube can be snapped into the inner circle of the clip. In certain embodiments, there may be a divot or inscribed circle on the interior of the circle, or within the material of the clip with a similar diameter of the cross sectional area of the mechanism used to connect the piezoelectric element to the amplifier. In particular embodiments, a groove or hole will be made on the inner arch of the clip for the wire to be permanently housed in. As will be understood from discussions herein, in some embodiments, the wire will not be able to slide laterally through the hole, so that the clip maintains a constant location on the wire.

According to one embodiment (not shown), the microphone element is connected to the amplifier by housing the microphone in at least a one compartment sleeve. In some embodiments, a sleeve will be made out of water tight, insulating material that can be easily cleaned, such as a type of smooth, thin plastic, or other like material. In particular embodiments, the sleeve may be cinched at both ends to ensure the ends of the sleeve remain at the end of the tube.

In yet another embodiment (not shown), the system may include a sleeve that has two compartments and runs the length of a typical CPAP/BiPAP® tube (e.g., approximately 6 feet). In this embodiment, the first compartment of the sleeve has approximately 150% the volume of the CPAP/BiPAP® tube, so that the tube can easily slide into the sleeve. In one embodiment, the second compartment of the sleeve is approximately one inch in diameter, and houses the wire that runs from the mask to the filter assembly. Additionally, according to at least one embodiment (not shown), wire is constructed in a helical shape to allow the wire to be intertwined with the tube.

Additional Embodiments

Patch Shape

As will be understood from discussions herein, the patch (e.g., base) may be any suitable shape. In various embodiments, the base is substantially circular, substantially rectangular, substantially triangular, etc. In particular embodiments, the base of the patch is substantially the size and shape of the flexible circuit.

Uses as a Diagnostic Aid

In one embodiment, the disclosed device removes all frequencies except the range of noises of respiratory noises. Respiratory noise frequency range may be contingent upon the persons spoken voice frequency range. In one embodiment, a calibration period would be necessary to obtain at least information about the frequency range of the subject's normal spoken voice.

Location of the Speaker

The amplifier and/or speaker unit may be placed anywhere on the mask tube machine interface. This includes, but is not limited to, on the mask, on the tube, on the hospital bed, on the CPAP/BiPAP® machine, or integrated into the CPAP/oxygen machine. Further, as discussed herein, one or more of the other components discussed herein may be located remotely or otherwise in a different physical location than other components (e.g., in one example, the patch may be disposable and may be operatively connected to an amplifier and speaker system that are not physically located on the mask, such that the patch can be disposed of, but the amplifier and speaker (and other components) can be reused).

If on the machine, the speaker will be attached to the outside of the machine via hook, velcro, pouch, or other means of attachment. The location of the speaker includes, but is not limited to, the top and sides of the machine, handles that are attached to the machine, the stand/cart, or other apparatus that houses the machine.

If on the hospital bed, the speaker may be attached or integrated via, but not limited to, hook, pouch or velcro. Integration of the speaker includes, but is not limited to, into the bed via manufacturing, audio cable, or through any form of wireless communication.

If on the mask, the speaker may be attached and/or integrated via, but not limited to, buttons, velcro, and epoxy. The speaker may be mounted anywhere on the exterior of the mask.

Methods of Use

The present disclosure contemplates methods of using the systems described herein, as will occur to one of ordinary skill. According to at least one embodiment, an exemplary method includes providing: A) a substantially T-shaped base having a thickness of between 49-401 μm and including a first width, a second width, and an adhesive portion for attaching the base to a mask, wherein the second width is greater than the first width; B) a flexible circuit operatively connected to the base, the flexible circuit including: C) a piezoelectric element, the piezoelectric element for detecting vibrations of the mask through the base and converting the vibrations to data; D) an electronic filter including a high pass filter for filtering the data to remove frequencies below about 300 Hz and a low pass filter for filtering the data to remove frequencies above about 3,000 Hz; E) at least one processor, the at least one processor: i) amplifies the data; and ii) transmits the data to a speaker for broadcasting the analog data as a representation of human voice; F) a flexible substrate element operatively attached to the base and covering at least a portion of the base and the flexible circuit for protecting the flexible circuit from outside interference; and G) a wax paper layer covering the adhesive portion of the base and sized such that at least a portion of the wax paper layer extends beyond an edge of the base.

According to at least one embodiment, an exemplary method includes: A) removing a wax paper layer covering an adhesive portion of a substantially T-shaped base having a thickness of between 49-401 μm, wherein the wax paper is sized such that at least a portion of the wax paper layer extends beyond an edge of the base; B) affixing the substantially T-shaped base to a hard plastic mask, wherein: 1) the substantially T-shaped base is operatively connected to a flexible circuit including: i) a piezoelectric element, the piezoelectric element for detecting vibrations of the mask through the base and converting the vibrations to data; ii) an electronic filter including a high pass filter for filtering the data to remove frequencies below about 300 Hz and a low pass filter for filtering the data to remove frequencies above about 3,000 Hz; and iii) at least one processor, the at least one processor: a) amplifies the data; and b) transmits the data to a speaker for broadcasting the analog data as a representation of human voice; and 2) a flexible substrate element is operatively attached to the base and covering at least a portion of the base and the flexible circuit for protecting the flexible circuit from outside interference.

Sensors/Computing System

From the foregoing, it will be understood that various aspects of the processes described herein are software processes that execute on computer systems that form parts of the system. Accordingly, it will be understood that various embodiments of the system described herein are generally implemented as specially-configured computers including various computer hardware components and, in many cases, significant additional features as compared to conventional or known computers, processes, or the like, as discussed in greater detail herein. Embodiments within the scope of the present disclosure also include computer-readable media for carrying or having computer-executable instructions or data structures stored thereon. Such computer-readable media can be any available media which can be accessed by a computer, or downloadable through communication networks. By way of example, and not limitation, such computer-readable media can include various forms of data storage devices or media such as RAM, ROM, flash memory, EEPROM, CD-ROM, DVD, or other optical disk storage, magnetic disk storage, solid state drives (SSDs) or other data storage devices, any type of removable non-volatile memories such as secure digital (SD), flash memory, memory stick, etc., or any other medium which can be used to carry or store computer program code in the form of computer-executable instructions or data structures and which can be accessed by a computer.

When information is transferred or provided over a network or another communications connection (either hardwired, wireless, or a combination of hardwired or wireless) to a computer, the computer properly views the connection as a computer-readable medium. Thus, any such a connection is properly termed and considered a computer-readable medium. Combinations of the above should also be included within the scope of computer-readable media. Computer-executable instructions include, for example, instructions and data which cause a computer to perform one specific function or a group of functions.

Those skilled in the art will understand the features and aspects of a suitable computing environment in which aspects of the disclosure may be implemented. Although not required, some of the embodiments of the claimed inventions may be described in the context of computer-executable instructions, such as program modules or engines, as described earlier, being executed by computers in networked environments. Such program modules are often reflected and illustrated by flow charts, sequence diagrams, exemplary screen displays, and other techniques used by those skilled in the art to communicate how to make and use such computer program modules. Generally, program modules include routines, programs, functions, objects, components, data structures, application programming interface (API) calls to other computers whether local or remote, etc. that perform particular tasks or implement particular defined data types, within the computer. Computer-executable instructions, associated data structures and/or schemas, and program modules represent examples of the program code for executing steps of the methods disclosed herein. The particular sequence of such executable instructions or associated data structures represent examples of corresponding acts for implementing the functions described in such steps.

Those skilled in the art will also appreciate that the claimed and/or described systems and methods may be practiced in network computing environments with many types of computer system configurations, including personal computers, smartphones, tablets, hand-held devices, multi-processor systems, microprocessor-based or programmable consumer electronics, networked PCs, minicomputers, mainframe computers, and the like. Embodiments of the claimed invention are practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

An exemplary system for implementing various aspects of the described operations, which is not illustrated, includes a computing device including a processing unit, a system memory, and a system bus that couples various system components including the system memory to the processing unit. The computer will typically include one or more data storage devices for reading data from and writing data to. The data storage devices provide nonvolatile storage of computer-executable instructions, data structures, program modules, and other data for the computer.

Computer program code that implements the functionality described herein typically includes one or more program modules that may be stored on a data storage device. This program code, as is known to those skilled in the art, usually includes an operating system, one or more application programs, other program modules, and program data. A user may enter commands and information into the computer through keyboard, touch screen, pointing device, a script containing computer program code written in a scripting language or other input devices (not shown), such as a microphone, etc. These and other input devices are often connected to the processing unit through known electrical, optical, or wireless connections.

The computer that effects many aspects of the described processes will typically operate in a networked environment using logical connections to one or more remote computers or data sources, which are described further below. Remote computers may be another personal computer, a server, a router, a network PC, a peer device or other common network node, and typically include many or all of the elements described above relative to the main computer system in which the inventions are embodied. The logical connections between computers include a local area network (LAN), a wide area network (WAN), virtual networks (WAN or LAN), and wireless LANs (WLAN) that are presented here by way of example and not limitation. Such networking environments are commonplace in office-wide or enterprise-wide computer networks, intranets, and the Internet.

When used in a LAN or WLAN networking environment, a computer system implementing aspects of the invention is connected to the local network through a network interface or adapter. When used in a WAN or WLAN networking environment, the computer may include a modem, a wireless link, or other mechanisms for establishing communications over the wide area network, such as the Internet. In a networked environment, program modules depicted relative to the computer, or portions thereof, may be stored in a remote data storage device. It will be appreciated that the network connections described or shown are exemplary and other mechanisms of establishing communications over wide area networks or the Internet may be used.

CONCLUSION

While various aspects have been described in the context of a particular embodiments, additional aspects, features, and methodologies of the claimed systems and methods will be readily discernible from the description herein, by those of ordinary skill in the art. Many embodiments and adaptations of the disclosure and claimed systems and methods other than those herein described, as well as many variations, modifications, and equivalent arrangements and methodologies, will be apparent from or reasonably suggested by the disclosure and the foregoing description thereof, without departing from the substance or scope of the claims. Furthermore, any sequence(s) and/or temporal order of steps of various processes described and claimed herein are those considered to be the best mode contemplated for carrying out the claimed systems and methods. It should also be understood that, although steps of various processes may be shown and described as being in a preferred sequence or temporal order, the steps of any such processes are not limited to being carried out in any particular sequence or order, absent a specific indication of such to achieve a particular intended result. In most cases, the steps of such processes may be carried out in a variety of different sequences and orders, while still falling within the scope of the claimed systems and methods. In addition, some steps may be carried out simultaneously, contemporaneously, or in synchronization with other steps.

The embodiments were chosen and described in order to explain the principles of the claimed systems and methods and their practical application so as to enable others skilled in the art to utilize the inventions and various embodiments and with various modifications as are suited to the particular use contemplated. Alternative embodiments will become apparent to those skilled in the art to which the claimed systems and methods pertain without departing from their spirit and scope. Accordingly, the scope of the claimed systems and methods are defined by the appended claims rather than the foregoing description and the exemplary embodiments described therein.

What is claimed is:

1. A system including a flexible patch for facilitating voice communication through a mask, the flexible patch comprising:
    a base that is substantially T-shaped and has a thickness of between 49-401 µm, the base comprising a first width, a second width, and an adhesive portion for attaching the base to a mask, wherein the second width is greater than the first width;
    a transducer, the transducer for detecting vibrations of the mask through the base and converting the vibrations to data; and
    a flexible substrate element operatively attached to the base, wherein the system transmits the data to a speaker for broadcasting the data as a representation of human voice.

2. The system of claim 1, wherein the flexible substrate element covers at least a portion of the base.

3. The system of claim 1, wherein the transducer is operatively connected to a power source.

4. The system of claim 1, wherein the transducer converts the vibrations to analog data.

5. The system of claim 4, wherein the system comprises an analog to digital converter for converting the analog data to digital data.

6. The system of claim 1, wherein the flexible patch comprises an electronic filter comprising a high pass filter and a low pass filter for removing frequencies below and above a typical human voice frequency range.

7. The system of claim 1, wherein the system comprises a digital signal processor, the digital signal processor for manipulating digital data prior to the digital data being transmitted to the speaker.

8. The system of claim 7, wherein the digital signal processor is wirelessly connected to the flexible circuit.

9. A system including a flexible patch for facilitating voice communication through a mask, the system comprising:
    a base comprising an adhesive portion for attaching the base to a mask, wherein the base has a thickness of between 49-401 µm and is operatively connected to a circuit;

a transducer operatively connected to the circuit, the transducer for detecting vibrations of the mask through the base and converting the vibrations to data;

a wiring sheath substantially surrounding wiring for protecting the wiring from outside interference;

a flexible substrate element operatively attached to the base and covering at least a portion of the base, the circuit, the wiring sheath, and the transducer, for protecting the circuit and the transducer from outside interference, wherein the flexible substrate element substantially conforms to the shape of the base and the wiring sheath; and an electronic filter operatively connected to the circuit, wherein the electronic filter filters the data to remove frequencies outside of a human voice frequency range, wherein the system is configured to transmit the data to a speaker for broadcasting the data as a representation of human voice.

10. The system of claim 9, wherein the circuit comprises a flexible circuit.

11. The system of claim 9, wherein the transducer comprises a piezoelectric element.

12. The system of claim 9, wherein an amplifier is operatively connected to the circuit for amplifying the data.

13. The system of claim 12, wherein the amplifier is integrated with the circuit.

14. The system of claim 9, wherein the base is substantially T-shaped.

15. The system of claim 9, wherein the transducer converts the vibrations to analog data.

16. The system of claim 15, wherein the system comprises an analog to digital converter for converting the analog data to digital data.

17. The system of claim 9, wherein a removable wax paper layer covers the adhesive portion of the base and is sized such that at least a portion of the wax paper layer extends beyond an edge of the base.

18. The system of claim 9, wherein a digital element is operatively connected to the circuit via a wireless radio.

19. The system of claim 18, wherein the wireless radio includes a Bluetooth device.

20. The system of claim 18, wherein the digital element is an amplifier and the electronic filter and the at least one processor amplifies and filters digital data.

21. The system of claim 18, wherein the digital element filters digital data to remove frequencies below about 350 Hz and above about 2,500 Hz.

* * * * *